US008954307B1

(12) United States Patent
O'Riordan et al.

(10) Patent No.: US 8,954,307 B1
(45) Date of Patent: Feb. 10, 2015

(54) CHAINED PROGRAMMING LANGUAGE PREPROCESSORS FOR CIRCUIT SIMULATION

(75) Inventors: Donald J. O'Riordan, Sunnyvale, CA (US); Richard J. O'Donovan, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 748 days.

(21) Appl. No.: 13/270,052

(22) Filed: Oct. 10, 2011

(51) Int. Cl.
*G06F 17/50* (2006.01)

(52) U.S. Cl.
USPC .......................................................... 703/14

(58) Field of Classification Search
USPC ........................................ 703/13, 14; 716/107
See application file for complete search history.

(56) References Cited

U.S. PATENT DOCUMENTS

| | | | | |
|---|---|---|---|---|
| 2004/0194038 | A1* | 9/2004 | Tamai | 716/1 |
| 2005/0278154 | A1* | 12/2005 | Abebe et al. | 703/2 |
| 2008/0216025 | A1* | 9/2008 | Furnish et al. | 716/2 |
| 2009/0254874 | A1* | 10/2009 | Bose | 716/6 |

OTHER PUBLICATIONS

"C Preprocessor", Wikipedia, http://en.wikipedia.org/wiki/C_preprocessor, (Jun. 16, 2011 accessed), 17 pgs.
"ECE Software", UC Davis Department of Electrical and Computer Engineering, http://www.ece.ucdavis.edu/cad/hspice/sci.electronics.cad-spice.html, (Jun. 14, 2011 accessed), 6 pgs.
"Netlist", Wikipedia, http://en.wikipedia.org/wiki/Netlist, (Aug. 15, 2011 accessed), 3 pgs.
"PHP", Wikipedia, http://en.wikipedia.org/w/index.php?title=PHP& printable=yes, (Aug. 17, 2011 accessed), 10 pgs.
"Python (Programming Language)", Wikipedia, http://en.wikipedia.org/wiki/Python_(programming_language), (Aug. 17, 2011 accessed), 14 pgs.
"SPICE (Simulation Program with Integrated Circuit Emphasis)", Wikipedia, http://en.wikipedia.org/wiki/SPICE, (Aug. 15, 2011 accessed), 7 pgs.

* cited by examiner

*Primary Examiner* — Eunhee Kim
(74) *Attorney, Agent, or Firm* — Kenyon & Kenyon LLP

(57) ABSTRACT

A netlist description that includes embedded code segments for describing a circuit is preprocessed in order to replace the embedded code segments with corresponding preprocessed code segments, where the preprocessed code segments include netlist code that can be parsed and executed. To perform this preprocessing, programming languages that include scripting operations are identified for the embedded code segments in the netlist description. A pipeline preprocessor that includes preprocessors for the identified programming languages is configured to sequentially process the netlist description and replace the embedded code segments with the corresponding preprocessed code segments.

21 Claims, 22 Drawing Sheets

```
* 4 BIT AND CIRCUIT
Simulator lang=spectre

<embedded code segment 1>

*** DEFINE NOMINAL CIRCUIT
.MODEL DMOD D
.MODEL QMOD NPN(BF=75 RB=100 CJE=1PF CJC=3PF)
VCC 99 0 DC 5V

<embedded code segment 2>

<embedded code segment 3>

X1 1 2 3 4 5 6 7 8 9 10 11 12 0 13 99 FOURBIT
RBIT0 9 0 1K
RBIT1 10 0 1K
RBIT2 11 0 1K
RBIT3 12 0 1K
RCOUT 13 0 1K

<embedded code segment 4>

.TRAN 1NS 6400NS
.OPTIONS ACCT LIST NODE LIMPTS=6401
.END
```

FIG. 9

```
1000 EMBEDDED CODE SEGMENT #1

<Ppython
URL = "http://www.ece.ucdavis.edu/cad/hspice/sci.electronics.cad-
spice.html'
class MYURL:
    def get_subckt(self, url,name) :
        "visit url, and return code listing for subckt name"
        import urllib
        in_subckt = False
        report = urllib.urlopen(url)
        for line in report.readlines ( ) :
            if line.find ( ".SUBCKT %s" % name) != -1:
                in_subckt = True
            if in_subckt:
                print line.strip()
            if in line.find ( ".ENDS %s" % name) != -1:
                in_subckt = False myurl = MYURL( )
myurl.get_subckt(URL,   "FOURBIT")
myurl.get_subckt(URL,   "TWOBIT")
myurl.get_subckt(URL,   "ONEBIT")
myurl.get_subckt(URL,   "NAND")
?>
```

FIG. 10

PREPROCESSED CODE SEGMENT #1
1100

```
.SUBCKT FOURBIT 1 2 3 4 5 6 7 8 9 10 11 12 13 14 15
*   NODES:   INPUT – BIT0(2) / BIT1(2) / BIT2(2) / BIT3(2),
*            OUTPUT – BIT0 / BIT1 / BIT2 / BIT3, CARRY-IN, CARRY-OUT, VCC
X1 1 2 3 4 9 10 13 16 15 TWOBIT
X2 5 6 7 8 11 12 16 14 15 TWOBIT
.ENDS FOURBIT
.SUBCKT TWOBIT 1 2 3 4 5 6 7 8 9
*   NODES:   INPUT – BIT0(2) / BIT1(2), OUTPUT – BIT0 / BIT1,
*            CARRY-IN, CARRY-OUT, VCC
X1 1 2 7 5 10 9 ONEBIT
X2 3 4 10 6 8 9 ONEBIT
.ENDS TWOBIT
.SUBCKT ONEBIT 1 2 3 4 5 6
*   NODES:   INPUT(2), CARRY-IN, OUTPUT, CARRY-OUT, VCC
X1 1 2 7 6 NAND
X2 1 7 8 6 NAND
X3 2 7 9 6 NAND
X4 8 9 10 6 NAND
X5 3 10 11 6 NAND
X6 3 11 12 6 NAND
X7 10 11 13 6 NAND
X8 12 13 4 6 NAND
X9 11 7 5 6 NAND
.ENDS ONEBIT
.SUBCKT NAND 1 2 3 4
*   NODES:   INPUT(2), OUTPUT, VCC
Q1 9 5 1 QMOD
D1CLAMP 0 1 DMOD
Q2 9 5 2 QMOD
D2CLAMP 0 2 DMOD
RB 4 5 4K
R1 4 6 1.6K
Q3 6 9 8 QMOD
R2 8 0 1K
RC 4 7 130
Q4 7 6 10 QMOD
DVBEDROP 10 3 DMOD
Q5 3 8 0 QMOD
.ENDS NAND
```

FIG. 11

1200 EMBEDDED CODE SEGMENT #2

```
<Ppython
for 1 in range(1, 9):
    mult = 2**(i-1)
    t1 = mult * 10
    t2 = mult * 50
    if i % 2:
        if 1 l= 1: # we will use a PWL for that case
            print "VIN%dA %d 0 PULSE(0 3 0 10NS 10NS %dNS %dNS)" % ((1+1)/2, I, t1, t2)
    else:
        print "VIN%dB %d 0 PULSE(0 3 0 10NS 10NS %dNS %dNS)" % ((1+1)/2, 1, t1, t2)
?>
```

FIG. 12

1300 PREPROCESSED CODE SEGMENT #2

VIN1B 2 0 PULSE(0 3 0 10NS 10NS 20NS 100NS)
VIN2A 3 0 PULSE(0 3 0 10NS 10NS 40NS 200NS)
VIN2B 4 0 PULSE(0 3 0 10NS 10NS 80NS 400NS)
VIN3A 5 0 PULSE(0 3 0 10NS 10NS 160NS 800NS)
VIN3B 6 0 PULSE(0 3 0 10NS 10NS 320NS 1600NS)
VIN4A 7 0 PULSE(0 3 0 10NS 10NS 640NS 3200NS)
VIN4B 8 0 PULSE(0 3 0 10NS 10NS 1280NS 6400NS)

1400 EMBEDDED CODE SEGMENT #3

```
<?python
from gen_pwl import PWLGen
pgen = PWLGen('adder.raw/transient.tran', 'v(1)', 200)
print "simulator lang=spectre"
print "VIN1A 1 0 vsource type=pwl wave=",
pgen.create_pwl()
print "simulator lang=spice"
?>
```

FIG. 14

1500 PREPROCESSED CODE SEGMENT #3 simulator land=spectre

VIN1A 0 vsource type=pwl wave= [ 0.0 0.0 6.25e-11 0.01875 1.875e-10 0.05625 4.375e-10
0.13125 7.42302e-10 0.22269 1.3519e-09 0.405571 2.02188e-09 0.606564 3.08388e-09 0.925164
3.45553e-09 1.03659 4.19813e-09 1.25944 4.83634e-09 1.4509 5.03804e-09 1.51141 5.44145e-09

_ snipped _

5.87231e-08 2.61592 5.89979e-08 2.6937 5.90405e-08 2.71216 5.91637e-08 2.7491 5.93382e-08
2.80147 5.95414e-08 2.86242 ]

simulator lang=spice

FIG. 15

1600 EMBEDDED CODE SEGMENT #4

```
<?php
for ( $1 = 1; $1 < 14; $1++ ) {
  Printf( ".PLOT TRAN V(%d)\n", $1);
  Printf( ".PRINT TRAN V(%d)\n, $1);
}
?>
```

FIG. 16

1700 PREPROCESSED CODE SEGMENT #4

```
.PLOT TRAN V(1)
.PRINT TRAN V(1)
.PLOT TRAN V(2)
.PRINT TRAN V(2)
.PLOT TRAN V(3)
.PRINT TRAN V(3)
_ snipped _

.PLOT TRAN V(12)
.PRINT TRAN V(12)
.PLOT TRAN V(13)
.PRINT TRAN V(13)
```

FIG. 17

CHAINED PROGRAMMING LANGUAGE PREPROCESSORS FOR CIRCUIT SIMULATION

BACKGROUND

1. Technical Field

The present disclosure relates to computer simulations generally and more particularly to computer simulations of circuit descriptions.

2. Description of Related Art

Circuit simulators typically operate on netlist code that describes the circuit model and specifies the simulation conditions. For example, the circuit model typically includes model elements (e.g., transistors), parameters (e.g., process/device), and connectivity (e.g., topology), and the simulation conditions typically include model inputs for the simulation interval (e.g., waveform profiles). However, related software for generating netlist code has typically not incorporated advanced programming features. Thus, there is a need for improved methods and related systems for generating netlist code for circuit simulation.

SUMMARY

Certain embodiments enable preprocessing a netlist description that includes embedded code segments for describing a circuit in order to replace the embedded code segments with corresponding preprocessed code segments, where the preprocessed code segments include netlist code that can be parsed and executed. To perform this preprocessing, programming languages that include scripting operations are identified for the embedded code segments in the netlist description. A pipeline preprocessor that includes preprocessors for the identified programming languages is configured to sequentially process the netlist description and replace the embedded code segments with the corresponding preprocessed code segments.

According to one embodiment, a method is provided to preprocess a netlist description that includes one or more embedded code segments for describing a circuit. The method includes specifying one or more programming languages to generate netlist code through scripting operations of the one or more programming languages. The method further includes scanning the netlist description to identify the one or more embedded code segments that are written in an identified programming language from the one or more specified programming languages, where the embedded code segment generates a preprocessed segment including at least some netlist code to replace the embedded code segment in the netlist description through the scripting operations of the identified programming language. The method further includes configuring a pipeline preprocessor to receive the netlist description and sequentially process the netlist description through one or more programming-language preprocessors that correspond to the one or more identified programming languages so that each programming-language preprocessor operates on at least one embedded code segment written in its corresponding programming language to generate at least one preprocessed segment that replaces the at least one embedded code segment in the netlist description. The method further includes using the pipeline preprocessor to generate a preprocessed netlist description where the one or more embedded code segments are replaced by the one or more preprocessed segments in the preprocessed netlist description.

Another embodiment relates to an apparatus for carrying out the above-described method, where the apparatus includes a computer for executing instructions related to the method. For example, the computer may include a processor for executing at least some of the instructions. Additionally or alternatively the computer may include circuitry or other specialized hardware for executing at least some of the instructions. In some operational settings, the apparatus may be configured as a system that includes one or more units, each of which is configured to carry out some aspects of the method either in software, in hardware or in some combination thereof. At least some values for the results of the method can be saved for later use in a computer-readable medium, including memory units and storage devices. Another embodiment relates to a computer-readable medium that stores (e.g., tangibly embodies) a computer program for carrying out the above-described method with a computer. In these ways aspects of the disclosed embodiments enable improved methods and related systems for generating netlist code.

BRIEF DESCRIPTION OF THE DRAWINGS

FIG. 9 is a listing of a netlist description for an embodiment related to the embodiment of FIG. 4.

FIG. 10 is a listing of the first embedded code segment for the embodiment of FIG. 9.

FIG. 11 is a listing of the first preprocessed code segment for the embodiment of FIG. 9.

FIG. 12 is a listing of the second embedded code segment for the embodiment of FIG. 9.

FIG. 14 is a listing of the third embedded code segment for the embodiment of FIG. 9.

FIG. 15 is a listing of the third preprocessed code segment for the embodiment of FIG. 9.

FIG. 16 is a listing of the fourth embedded code segment for the embodiment of FIG. 9.

FIG. 17 is a listing of the fourth preprocessed code segment for the embodiment of FIG. 9.

DETAILED DESCRIPTION OF EXAMPLE EMBODIMENTS

Figure 1:
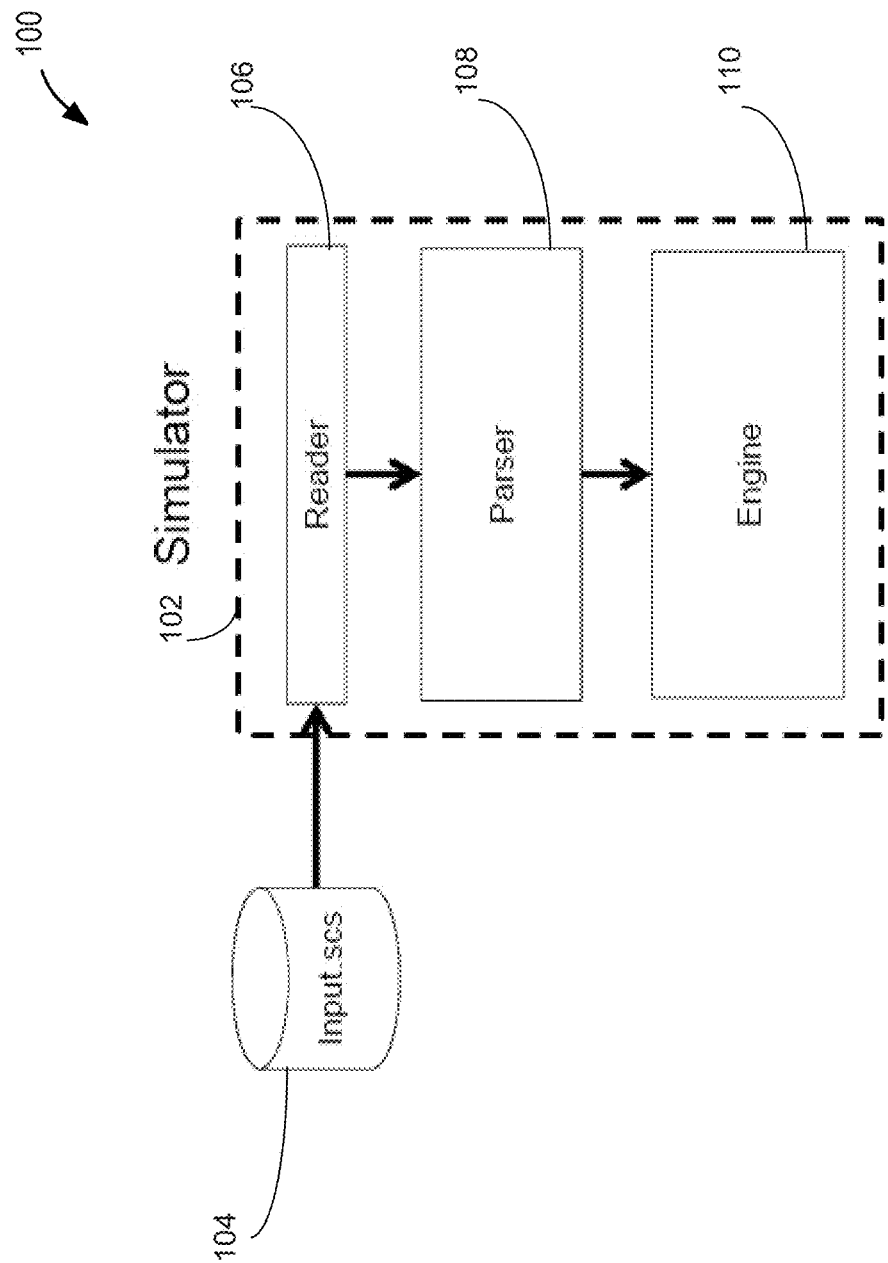
FIG. 1 is a flow diagram that illustrates operations of a circuit simulation system.

FIG. 1 shows a flow diagram that illustrates operations of a circuit simulation system 100. The system 100 includes a circuit simulator 102 that receives an input file 104 that includes netlist code to describe a circuit for simulation. The simulator includes a reader 106 that reads in the input file 104, a parser 108 that determines the netlist elements by extracting them from the file and converting them into tokens, and a simulation engine 110 that simulates the circuit based on extracted network elements or their equivalent tokens. For example, the engine 110 and related system 100 may be based on an implementation of SPICE (Simulation Program with Integrated Circuit Emphasis). The reader 106 may be a conventional file reader. The parser 108 may include, or in some contexts be replaced by, a lexer that performs lexical analysis on the file contents.

Limited generalizations of the system 100 have allowed for netlist descriptions that are more general than basic netlist code that can be parsed by the parser 108 and executed by the simulation engine 110. In some operational settings, a C Preprocessor has been included between the reader 106 and the parser 108 in FIG. 1. That is, after the input file 104 is read into the simulator 102, a C Preprocessor can be used to carry out relatively simple operations such as the inclusion of file headers and macro expansions (e.g., substitutions of netlist code for a designated variable in the input file).

Figure 2:
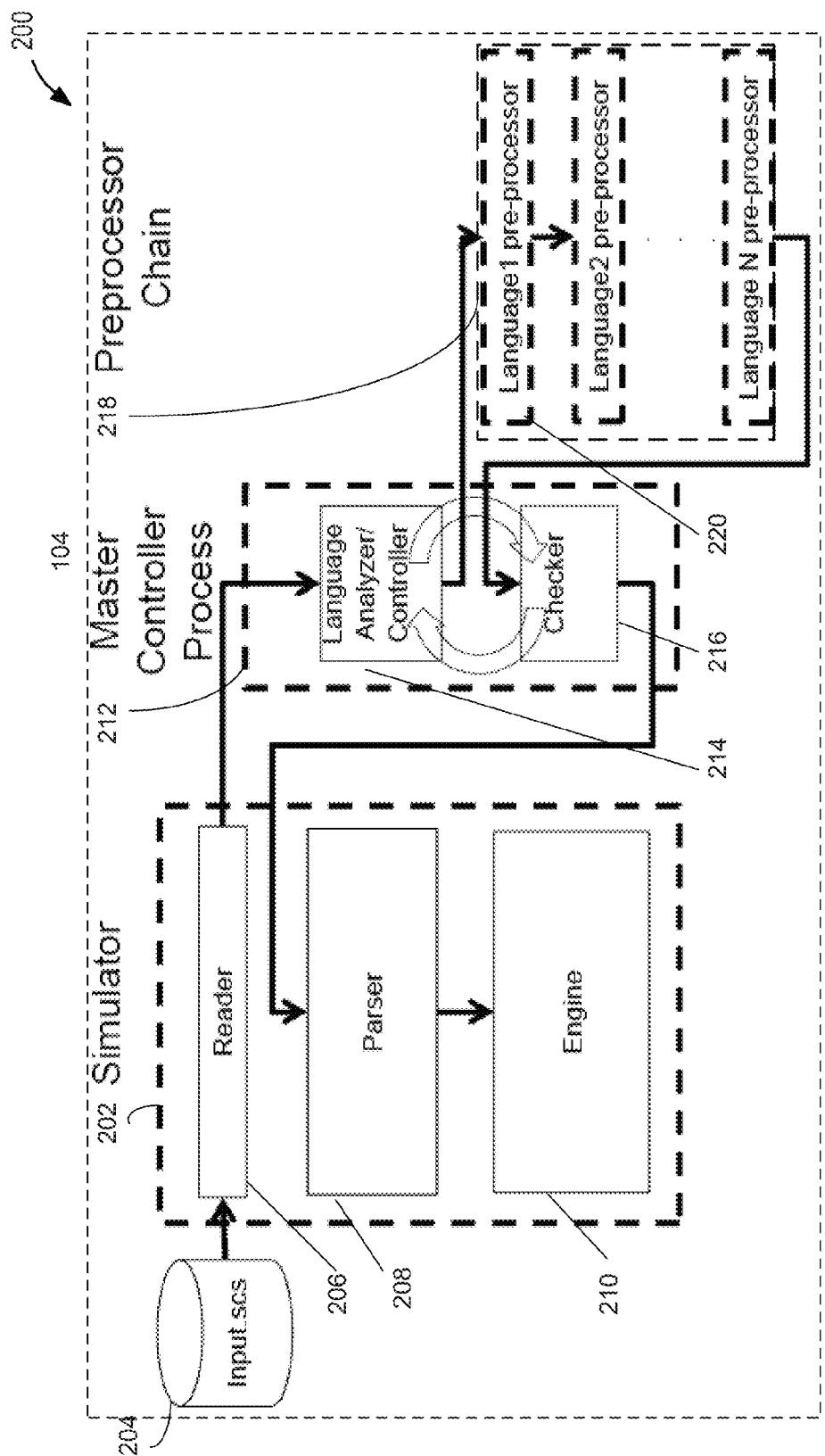
FIG. 2 is a flow diagram that illustrates operations of an example embodiment of a circuit simulation system.

FIG. 2 shows a flow diagram that illustrates an example embodiment of a circuit simulation system 200 that incorporates programming language functionality including scripting operations that enable the generation of executable netlist code. These scripting operations may include internal variables (e.g., to be evaluated for different circuit options), control structures (e.g., if-then-else statements, execution loops), external access (e.g., to a repository site via the Internet). Programming structures may also incorporate advanced features from Object Oriented Programming such as data abstraction, encapsulation, messaging, modularity, polymorphism, and inheritance.

For example, referencing an external site through a Uniform Resource Identifier (URI) can enable access to circuit models in specific netlist languages (e.g., SPICE). Similarly, referencing an external site can enable the creation of a stimulus whose voltage or current waveform tracks that the results of a previous simulation of the same or a different circuit. Control structures can be used to create parameterized topology generators for model elements (e.g., a parameterized cell (PCell)). Control structures can also be used to create an analysis generator (or option generator) that is capable of performing analysis loops, a desirable feature that is generally unavailable in netlist languages, in order to obtain a range of node voltages or to run an arbitrary loop-based analysis sequence.

The system includes a simulator 202 that receives an input file 204 that includes a netlist description that can be more general than executable netlist code. That is, the input file 204 may include embedded code segments written in programming languages that include scripting operations for generating executable netlist code. As in the system 100 of FIG. 1, the simulator includes a reader 106 that reads in the input file 104, a parser 108 that determines the netlist elements by extracting them from the file and converting them into tokens, and a simulation engine 110 that simulates the circuit based on extracted network elements or their equivalent tokens. Additionally the system 200 includes a master controller process 21 that includes a language analyzer/controller 214 and a checker 216. The language analyzer/controller analyzes the input file 204 to identify the embedded code segments and their corresponding programming languages, which preferably have been specified or registered in the system 200 for this purpose.

As embedded code segments are identified by the language analyzer/controller, the master controller process 212 configures a preprocessor chain 218, also described as a pipeline preprocessor, that includes a language preprocessor 220 for each identified programming language. That is, each preprocessor reads from its standard input (stdin) and writes to its standard output (stdout), and the preprocessors are arranged in a sequence so that the standard output of one preprocessor is the standard input of the next processor in the sequence. Each preprocessor operates on embedded code segments written in its corresponding programming language to generate corresponding preprocessed code segments that are written to its standard output. Additionally, each preprocessor writes other portions of the netlist description directly (e.g., verbatim) to its standard output including netlist code as well as embedded code segments that are not written in its corresponding programming language.

As a result, the netlist description corresponding to the input file 204 can be sequentially processed by the components of the preprocessor chain 218 to replace the embedded code segments with preprocessed segments. These preprocessed segments may be entirely executable netlist code or may include further embedded code segments.

The checker 216 then evaluates the output from the preprocessor chain 218 to determine if additional embedded code segments are present (e.g. as a result of executing an embedded code segment). If additional embedded code segments are detected by the checker 216, then the operations of the language analyzer/controller 214 and the preprocessor chain can be repeated until the checker 216 detects executable netlist code with no embedded code segments. That is, when the checker 216 detects at least one embedded code segment in the output buffer of the preprocessor chain 218, the output buffer of the checker 216 is directed to the language analyzer/controller 214 for further processing through the preprocessor chain 218. Finally, when the checker 216 detects no more embedded code segments 216 in the output buffer of the preprocessor chain 218, the output buffer of the checker 216 is directed to the parser 208 and the engine 210 as in the system 100 of FIG. 1.

Figure 3:
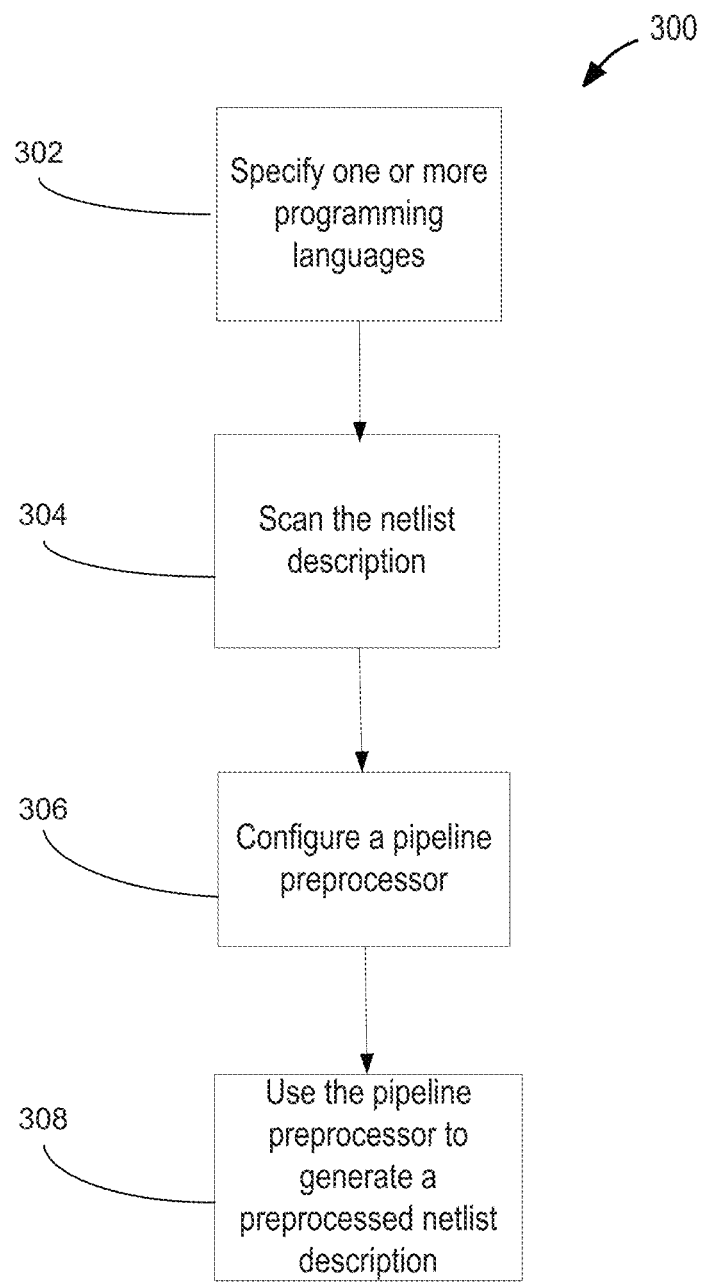
FIG. 3 is a flowchart that illustrates a method of preprocessing a netlist description according to an example embodiment

In correspondence to the system 200 of FIG. 2, FIG. 3 shows a flowchart that illustrates a method 300 of preprocessing a netlist description that includes one or more embedded code segments for describing a circuit according to an example embodiment. A first operation 302 includes specifying one or more programming languages to generate netlist code through scripting operations of the one or more programming languages. (Note that the words first, second, etc. are used here and elsewhere for labeling purposes only and are not intended to denote any specific spatial or temporal ordering. Furthermore, the labeling of a first element does not imply the existence a second element.)

A second operation 304 includes scanning the netlist description to identify the one or more embedded code segments. Each embedded code segment is written in an identified programming language from the one or more specified programming languages to generate a preprocessed segment to replace the embedded code segment in the netlist description through the scripting operations of the identified programming language. In general, a preprocessed segment includes at least some executable netlist code but may include additional embedded code segments that require further processing. In some embodiments the first operation 302 and the second operation 304 may be combined so that the programming languages identified when scanning the netlist description are then specified (or registered) as programming languages for subsequent operations.

A third operation 306 includes configuring a pipeline preprocessor as a preprocessor chain to receive the netlist description and sequentially process the netlist description through one or more programming-language preprocessors that correspond to the one or more identified programming languages. Then each programming-language preprocessor operates on at least one embedded code segment written in its corresponding programming language to generate at least one preprocessed segment that replaces the at least one embedded code segment in the netlist description.

A fourth operation 308 includes using the pipeline preprocessor to generate a preprocessed netlist description so that the one or more embedded code segments are replaced by the one or more preprocessed segments in the preprocessed netlist description.

As discussed above, the scripting operations of the programming languages may include a variety of features. For example, control structures may generate corresponding netlist code by performing a branching operations (e.g., if-then-else). Internal state variables may be accessed for different circuit configurations. External repository sites may be accessed to incorporate additional models and parameters. Programming structures may also incorporate advanced features from Object Oriented Programming such as data abstraction, encapsulation, messaging, modularity, polymorphism, and inheritance.

As discussed above, a preprocessed segment may include additional embedded segments in which case the method can be continued recursively until no more embedded segments are present in the current preprocessed netlist description. Then, as illustrated in FIG. 2, the preprocessed netlist description can be parsed to determine the netlist elements (e.g., reduced to tokens), and these netlist elements can be processed by the netlist engine to simulate the circuit.

Figure 4:
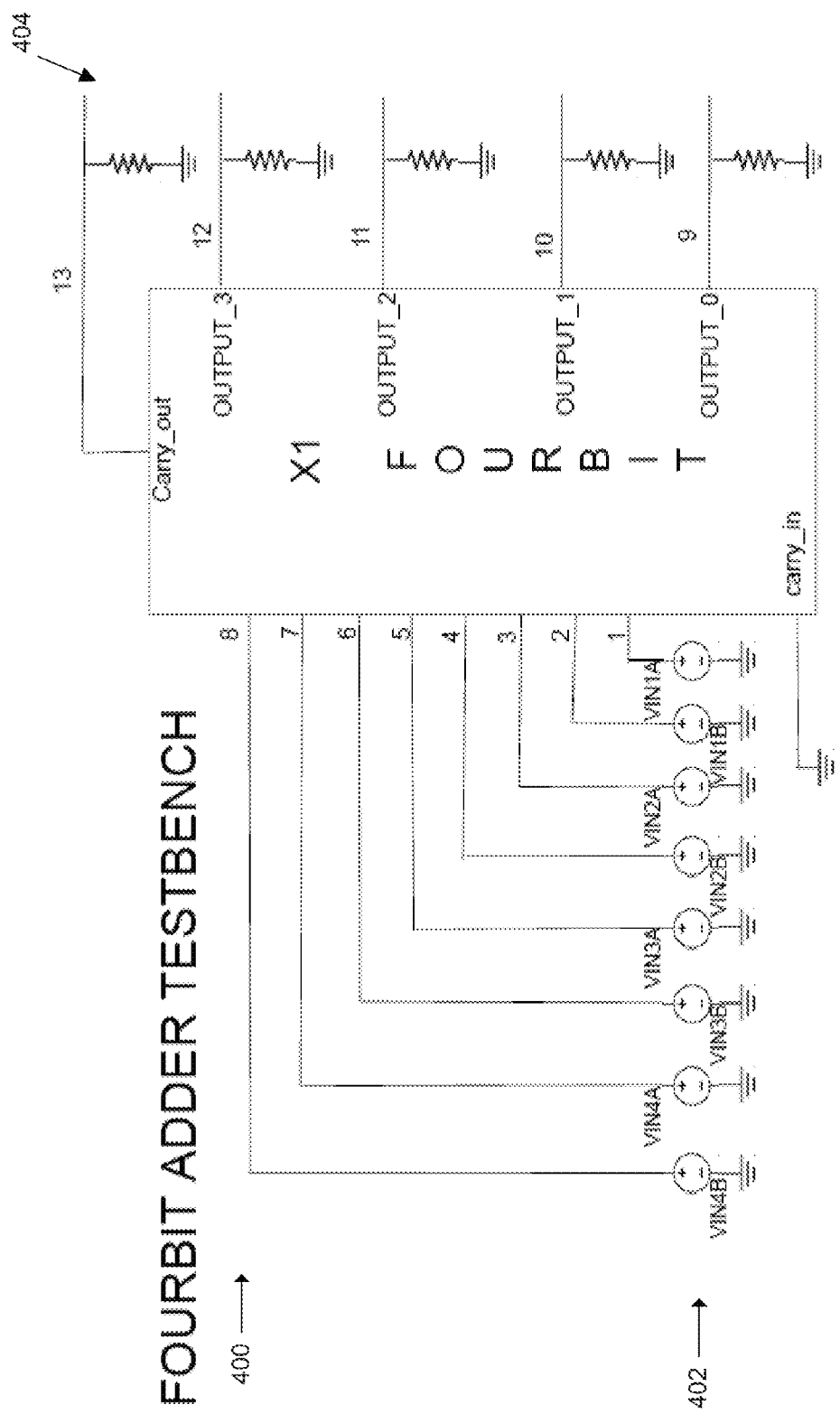
FIG. 4 is a diagram of four-bit adder testbench for an example embodiment.

FIGS. 4-8 show circuit diagrams that illustrate recursive circuit definitions in an example embodiment. FIG. 4 shows a four-bit adder 400 that includes eight inputs (VIN1A-VIN4A and VIN1B-VIN4B) plus an input carry bit (Carry_in) and four outputs (OUTPUT_0-OUTPUT_3) plus an output carry bit (Carry_out). The four-bit adder testbench includes eight voltages sources 402 on the input side and five resistors 404 on the output side. In the subsequent FIGS. 5-8, voltage/power connections have been omitted for improved clarity.

Figure 5:
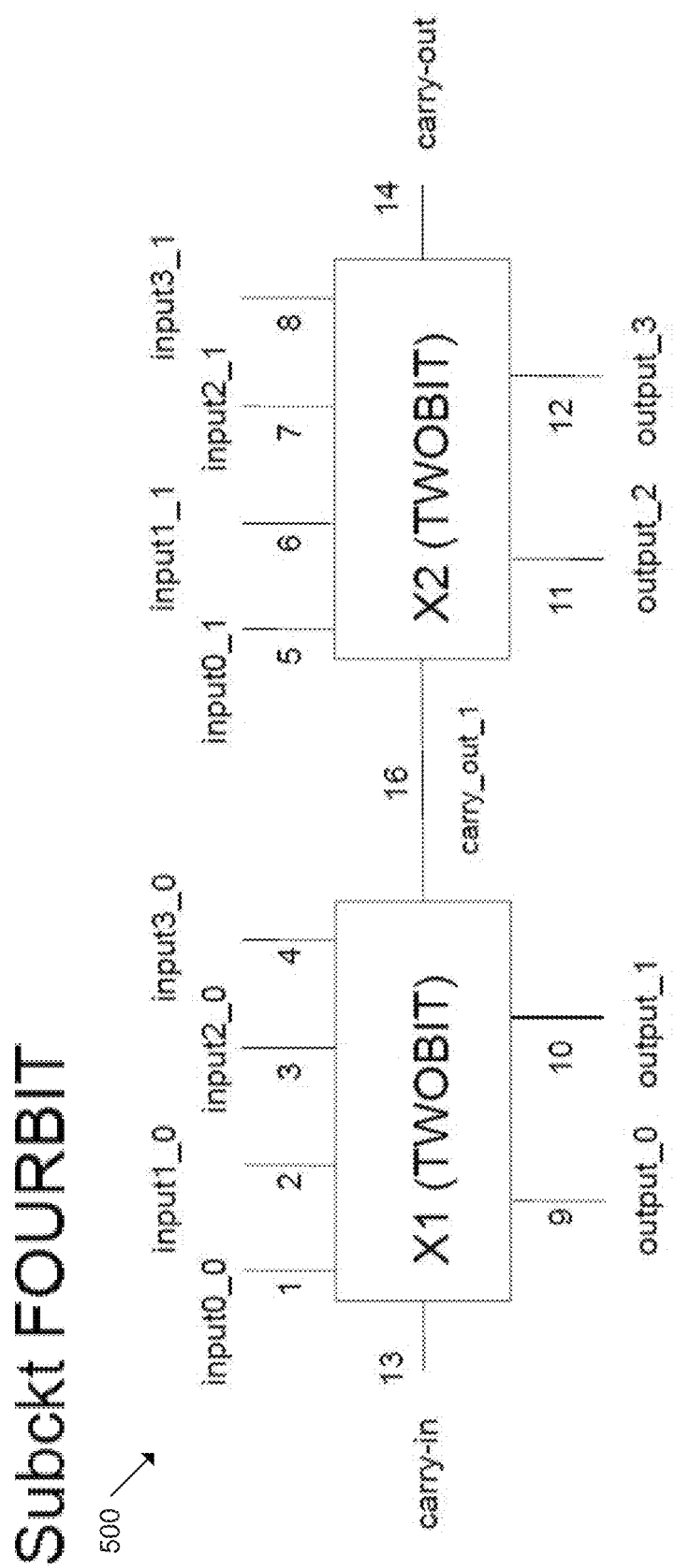
FIG. 5 is four-bit adder for the embodiment of FIG. 4.

FIG. 5 shows a four-bit adder 500 that has been decomposed into two two-bit adders (X1(two-bit), X2(two-bit)) so that the signals can be identified with the signals of the four-bit adder 400 of FIG. 4. The first two-bit adder X1 has four inputs (input0_0-input3_0) that correspond to the first four inputs of FIG. 4 (VIN1A, VIN1B, VIN2A, VIN2B) and two outputs (output_0, output_1) that correspond to the first two outputs of FIG. 4 (OUTPUT_0, OUTPUT_1). The second two-bit adder X2 has four inputs (input0_1-input3_1) that correspond to the second four inputs of FIG. 4 (VIN3A, VIN3B, VIN4A, VIN4B) and two outputs (output_2, output_3) that correspond to the second two outputs of FIG. 4 (OUTPUT_2, OUTPUT_3). The first two-bit adder X1 receives an input carry bit (carry-in) that corresponds to the input carry bit of FIG. 4 (Carry_in), and the second two-bit adder X2 outputs an output carry bit (carry-out) that corresponds to the output carry bit of FIG. 4 (Carry_out). In FIG. 5, an internal carry bit (carry_out_1) is an output of the first two-bit adder X1 and an input of the second two-bit adder X2.

Figure 6:
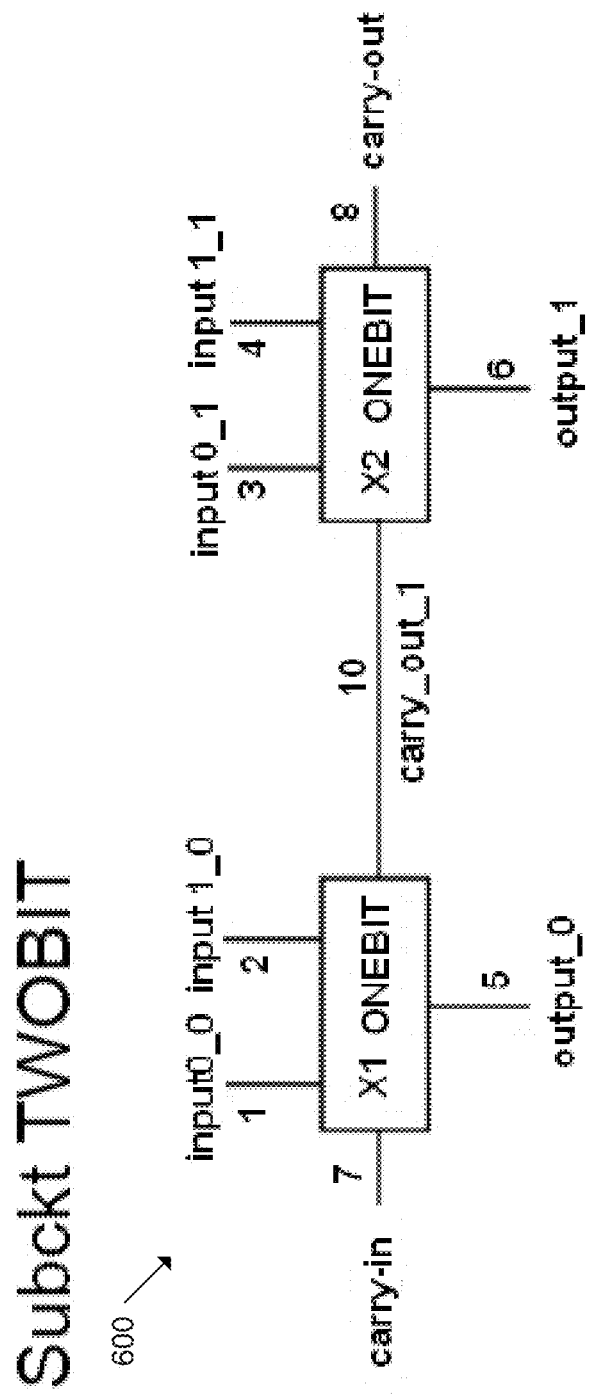
FIG. 6 is a diagram of a two-bit adder for the embodiment of FIG. 4.

FIG. 6 shows a two-bit adder 600 that has been decomposed into two one-bit adders (X1(one-bit), X2(one-bit)) so that the signals can be identified with the signals of either one of the two-bit adders (X1(two-bit), X2(two-bit)) of FIG. 5. For example, the first one-bit adder X1 has two inputs (input0_0, input 1_0) that correspond to the first two inputs of the first two-bit adder of FIG. 5 (input0_0, input1_0) and one output (output_0) that correspond to the first output of the first two-bit adder of FIG. 5 (output_0). The second one-bit adder X2 has two inputs (input0_1, input1_1) that correspond to the second two inputs of the first two-bit adder of FIG. 5 (input2_0, input3_0) and one output (output_1) that correspond to the second output of the first two-bit adder of FIG. 5 (output_1). The first one-bit adder X1 receives and input carry bit (carry-in) that corresponds to the input carry bit of FIG. 5 (carry-in), and the second one-bit adder X2 outputs an output carry bit (carry-out) that corresponds to the output carry bit of FIG. 5 (carry-out). In FIG. 6, an internal carry bit (carry_out_1) is an output of the first one-bit adder X1 and an input of the second one-bit adder X2.

Figure 7:
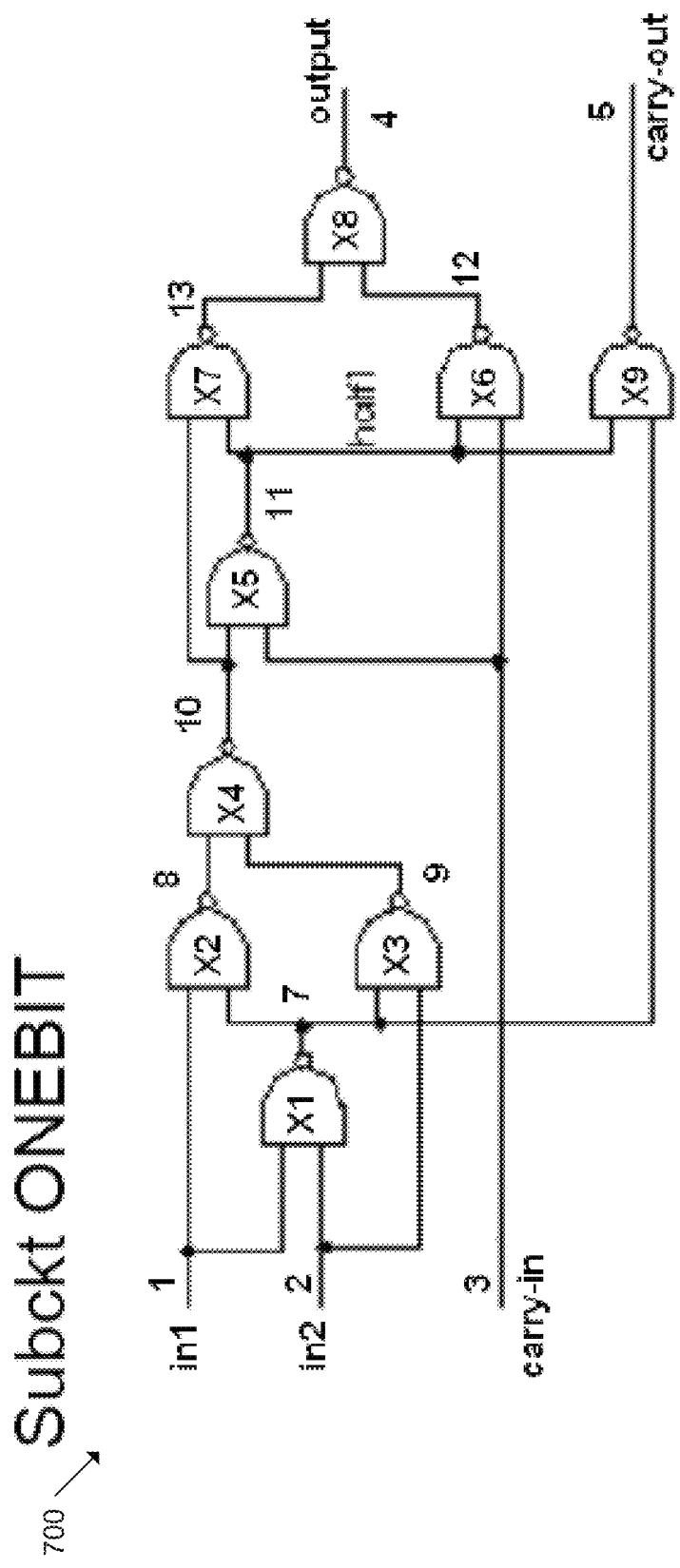
FIG. 7 is a diagram of a one-bit circuit for the embodiment of FIG. 4.

FIG. 7 shows a one-bit circuit 700 that has been decomposed into NAND gates (X1-X9) so that the signals can be identified with the signals of either one of the one-bit adders (X1(one-bit), X2(one-bit)) of FIG. 6. For example, the one bit circuit 700 has two inputs (in1, in2) that correspond to the two inputs of the first one-bit adder of FIG. 6 (input0_0, input1_0) and one output (output_0) that correspond to the output of the first one-bit adder of FIG. 6 (output_0). Additionally, the one-bit circuit 700 receives and input carry bit (carry-in) that corresponds to the input carry bit of FIG. 6 (carry-in) and outputs an output carry bit (carry-out) that corresponds to the output carry bit of FIG. 6 (carry-out).

Figure 8:
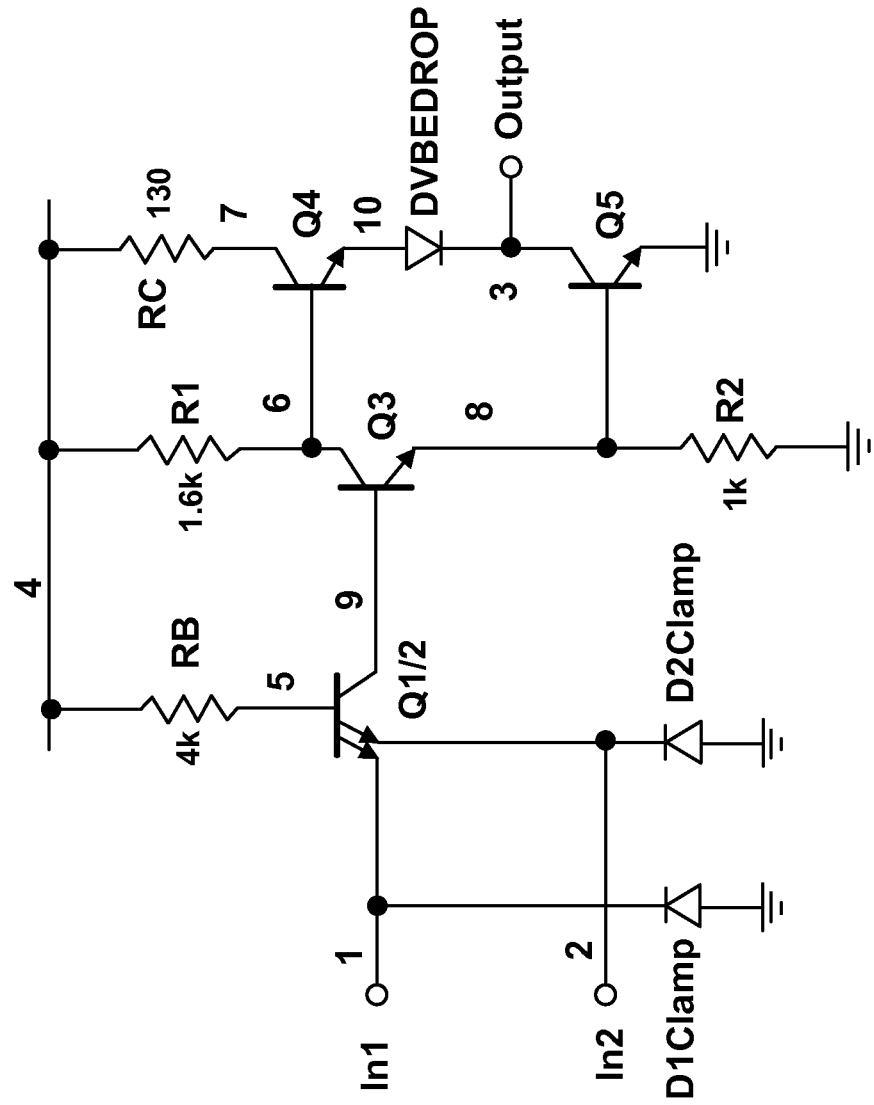
FIG. 8 is a diagram of an NAND gate for the embodiment of FIG. 4.

FIG. 8 shows a NAND gate 800 that may correspond to any one of the NAND gates of FIG. 7 (X1-X9). The NAND gate 800 is shown at the device level as a TTL (Transistor-Transistor Logic) NAND gate including resistors (R1, R2, RB, RC), transistors (Q1/2, Q3, Q4, Q5), and diodes (D1Clamp, D2Clamp, DVBEDROP). The NAND gate 800 has two inputs (in1, in2) and one output (Output)

FIG. 9 shows a netlist description 900 based on the four-bit adder illustrated in FIGS. 4-8 for an example embodiment. Four embedded code segments are represented with bracket delimiters at lines 4, 11, 13, and 22. In an actual implementation the corresponding code (e.g., from FIGS. 10, 12, 14, and 16) could be included directly (e.g., by substituting for the bracketed quantities) or indirectly (e.g., via a "#include" statement using a C preprocessor). Additional portions of the netlist description 900 include a specification the simulation language Spectre (line 2), nominal circuit definitions (lines 6-9), resistor values (lines 15-19), and simulation conditions (lines 24-26). Although the simulation language Spectre is used in this embodiment, other simulation languages based on SPICE may also be used as well as other software implementations for EDA (Electronic Design Automation).

As illustrated in the embodiments of FIGS. 2 and 3, the netlist description 900 can be processed to replace the embedded code segments with preprocessed code segments including netlist code that is executable by the simulation engine 210, here specified as a SPICE simulation engine.

With reference to FIG. 3, in the first operation 302 one or more programming languages are specified (or registered) for subsequent operations. In this case the relevant programming languages are PHP and Python. As discussed above, the relevant programming languages can be determined as part of the scanning operations. In the second operation 304, the netlist description is scanned to identify the embedded code segments including the embedded code segment #1 (FIG. 10), embedded code segment #2 (FIG. 12), embedded code segment #3 (FIG. 14), and embedded code segment #4 (FIG. 16). In the third operation 306, a pipeline preprocessor is configured including a PHP preprocessor and a Python pre-processor since the corresponding programming languages have been identified in the embedded code segments. In the third operation 308, the pipeline preprocessor is used to generate a preprocessed netlist description where embedded code segment #1 (FIG. 10) has been replaced by preprocessed code segment #1 (FIG. 11), embedded code segment #2 (FIG. 12) has been replaced by preprocessed code segment #2 (FIG. 13), embedded code segment #3 (FIG. 14) has been replaced by preprocessed code segment #3 (FIG. 15), and embedded code segment #4 (FIG. 16) has been replaced by preprocessed code segment #4 (FIG. 17).

FIG. 10 shows the first embedded code segment 1000, which is marked or tagged by delimiters "<?" (line 1) and ">" (line 22). The segment 1000 includes code (e.g., a token) that specifies the programming language Python (line 1), an on-line access site, identified by a Uniform Resource Locator (URL), for accessing circuit/sub-circuit definitions (line 2), a definition for a MYURL Python class including a class method defined as get_subckt( ) (lines 3-15), and subroutine calls for the four sub-circuit definitions as given in FIGS. 5-8 (lines 17-21). The first embedded code segment 1000 operates to access the given URL using standard Python library classes. The resulting HyperText Markup Language (HTML) document is scanned for sections of code delimited by ".SUBCKT"and".ENDS" in order to download sub-circuit definitions for "FOURBIT," "TWOBIT," "ONEBIT," and "NAND." This embodiment illustrates the desirable application of Python libraries and object oriented programming to the generation of a SPICE netlist.

FIG. 11 shows the first preprocessed code segment 1100, which corresponds to the first embedded code segment 1000. The segment 1100 includes definitions for a four-bit adder 500 represented as two two-bit adders (lines 1-6), a two-bit adder 600 represented as two one-bit adders (7-12 lines), a one-bit adder circuit 700 decomposed into NAND gates (lines 13-24), and a NAND gate 80 decomposed into device elements (lines 25-39).

FIG. 12 shows the second embedded code segment 1200, which is marked by delimiters "<?" (line 1) and ">" (line 11). The segment 1200 includes code that specifies the programming language Python (line 1), a loop structure in the Python language for using the SPICE function Pulse to generate voltage source stimuli (e.g., waveform inputs) for seven of the eight inputs (lines 2-10). This code snippet iterates over a range of values from 1 to 8 inclusive, and generates voltage stimuli to stdout for all values of i except for the special case where i is equal to 1. This embodiment illustrates the desirable application of Python loop structures to generate SPICE netlist code. The final two parameters to each PULSE routine call are time values that are calculated as functions of the loop index i (lines 8, 10).

Figure 13:
FIG. 13 is a listing of the second preprocessed code segment for the embodiment of FIG. 9.

FIG. 13 shows the second preprocessed code segment 1300, which corresponds to the second embedded code segment 1200. The segment 1300 includes seven calls to the SPICE waveform generation function Pulse for the input channels numbered 2-8 in FIG. 4 (lines 1-7).

FIG. 14 shows the third embedded code segment 1400, which is marked by delimiters "<?" (line 1) and "?>" (line 8). The segment 1400 includes code that specifies the programming language Python (line 1), and code that uses a Python utility class PWLGen to generate a special case waveform input for one of the eight inputs (lines 2-7). The third embedded code segment 1400 operates to construct a piece-wise linear (PWL) voltage source, by specifying the PWL parameter values using the Python utility class PWLGen. The Python class takes the name of a set of previously performed simulation results ("adder.raw/transient1.tran"), a node identifier (v(1)), and a number of data points (200), and generates the piece-wise linear coefficients to regenerate that waveform in as PWL Spectre voltage source (line 3). This embodiment illustrates the desirable application of Python control structures to generate SPICE netlist code that includes a lengthy sequence of waveform values by accessing previous simulation results.

FIG. 15 shows the third preprocessed code segment 1500, which corresponds to the third embedded code segment 1400. The segment 1500, which has been snipped for brevity, includes Spectre/SPICE language indications (lines 1, 12), and a sequence of time and voltage values that have been generated by piece-wise linear operations for the input channel numbered 1 in FIG. 4 (lines 3-10). As noted previously, specific simulator languages are used for illustrative purposes in this embodiment. Other SPICE/EDA simulators may also be used.

FIG. 16 shows the fourth embedded code segment 1600, which is marked by delimiters "<?" (line 1) and "?>" (line 5). The segment 1600 includes code that specifies the progranuning language PHP (line 1), and code that specifies a loop structure in the PHP language to generate plot and print commands in SPICE (lines 2-5). This embodiment illustrates the desirable application of PHP loop structures to generate SPICE netlist code that includes a lengthy sequence of plot and print statements.

FIG. 17 shows the fourth preprocessed code segment 1700, which corresponds to the fourth embedded code segment 1600. The segment 1700, which has been snipped for brevity, includes SPICE language commands for plotting and printing waveform values for the channels numbered 1-13 in FIG. 4 (lines 1-12).

Figure 18:
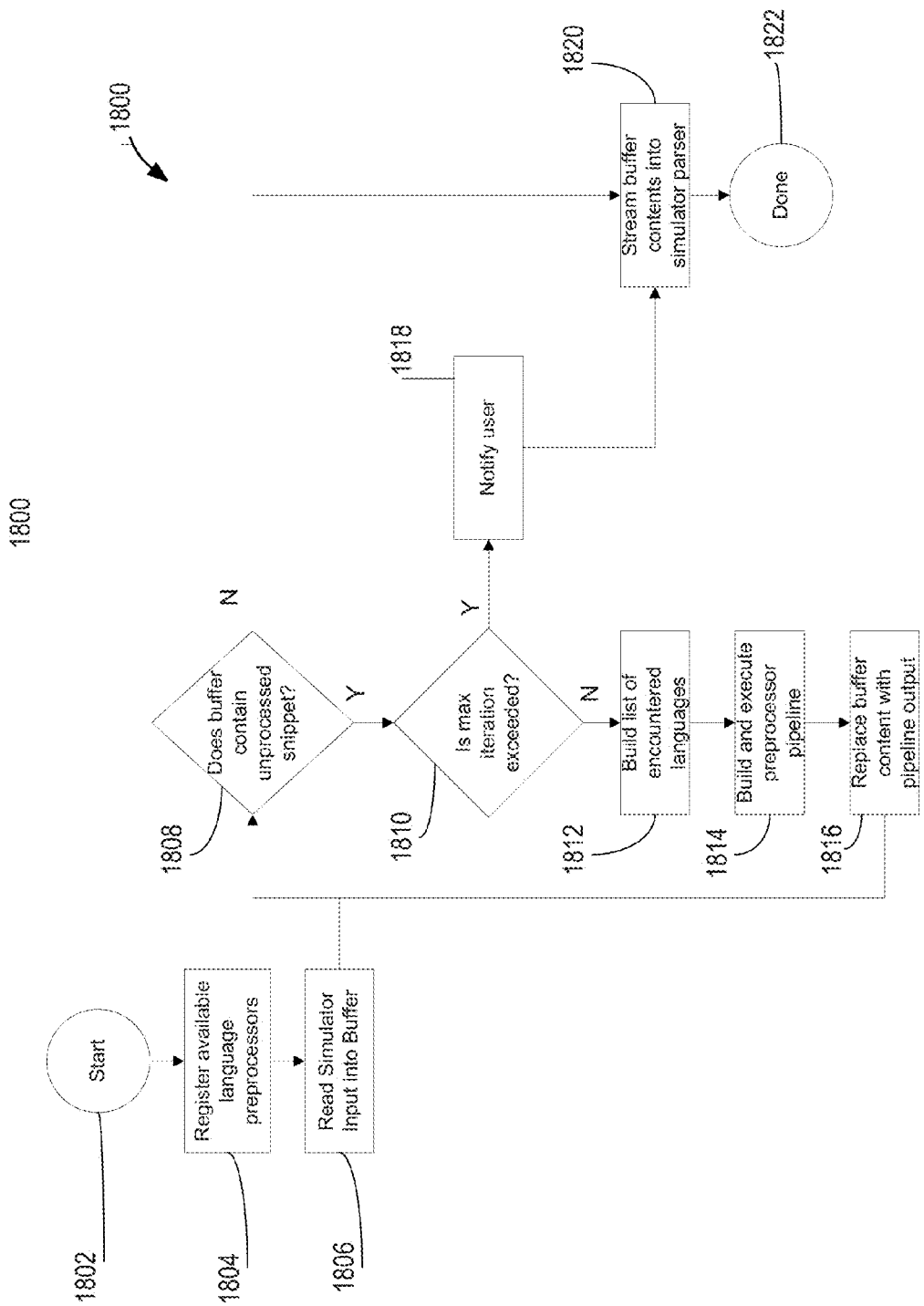
FIG. 18 is a flowchart that illustrates a method of preprocessing a netlist description according to another example embodiment

Depending on the requirements of the implementation, the operations carried out by the system 200 of FIG. 2, may include additional features such as buffer operations, maximal iteration counts, and user notifications. FIG. 18 shows a flowchart for a method 1800 of preprocessing a netlist description as performed by the master controller process 212 of FIG. 2. The method is initialized at step 1802 (e.g., by a user input or some automatic condition such as the identification of an input file). In step 1804, a list of language processors are registered. Each item in the list represents a mapping from a language name (e.g., as represented within a code snippet by a token such as "<?python . . . ?>" or "<?php . . . ??>," etc.) to the system path of the corresponding program executable that will be used to evaluate the actual code snippet (e.g., as represented by the " . . . " items in those tokens). The system allows for multiple languages to be registered/mapped in such a manner (e.g., additional languages such as Perl or Tcl).

In step 1806, the simulator input stream (e.g., netlist file contents) is captured into a memory buffer. In step 1808, the buffer is inspected to determine if it contains any code snippets which have not yet been processed. If it is determined that code snippets have not yet been processed, execution continues with step 1810, in which it is determined if a maximum set of iterations has been exceeded. If the maximum set has not been exceeded, execution continues with step 1812, in which a list of actually encountered languages/code snippets is built up. (The processes of step 1812 are further described in the flowchart of FIG. 19.) Once step 1812 has been executed and the list of encountered languages is known, the process continues with step 1814, in which a pipeline of language processors, one per actually encountered language, is built and configured. (The processes of step 1814 are further described in the flowchart of FIG. 20.)

The process continues in step 1816 by replacing the contents of the memory buffer, which originally represented the simulator input file containing embedded code snippets, with the captured output of the language preprocessor pipeline, in which individual evaluated code snippet outputs are used to replace the code snippets themselves. Note that these outputs may contain dynamically generated additional code snippets. If so, the test at step 1808 is repeated to determine if the language processing pipeline operation needs to be repeated in order to process those remaining code snippets, which could again produce additional output snippets. A safety check at step 1810 is introduced to avoid infinite loop situations, ensuring that no more than some maximum number of iterations is produced before informing the user via step 1818, and proceeding to the finish via step 1820, in which the final buffer contents are directed to the simulator's parser 208 and the process terminates at step 1822. In the non-infinite loop scenario, the test at step 1810 determines that there are no remaining code snippets that correspond to registered languages present in the memory buffer, and the process continues in its normal manner by directing the memory buffer contents, which now represent the fully preprocessed text, to the simulator's parser 208 at step 1820.

Figure 19:
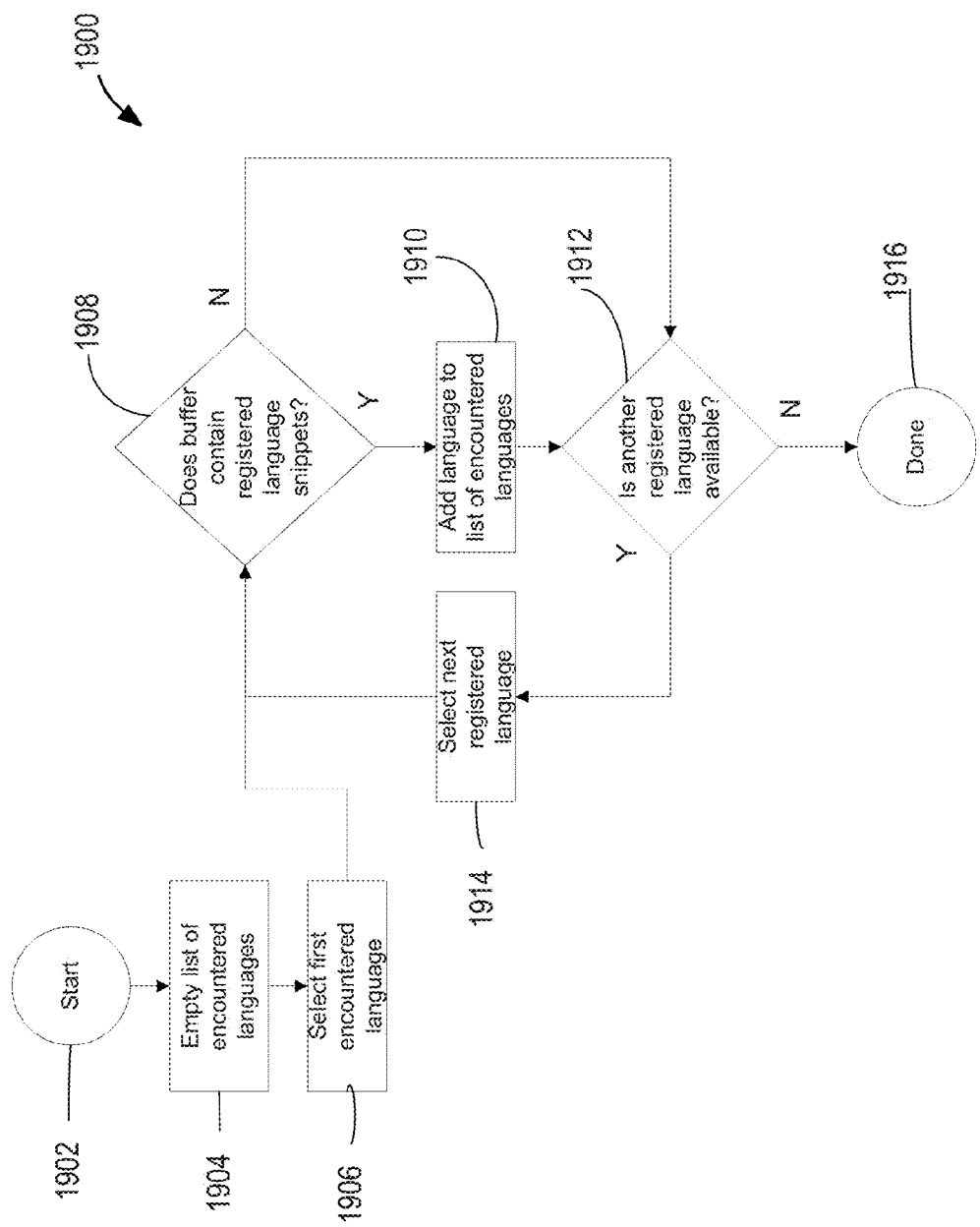
FIG. 19 is a flowchart that illustrates further detail of the embodiment of FIG. 18.

The flow chart of FIG. 19 shows further detail of step 1812 of FIG. 18. This process 1900, in which the memory buffer is inspected to see which of the registered languages have corresponding code snippets which need to be processed, is initialized at step 1902 by step 1812 of FIG. 18 as discussed above. In step 1904 the list of encountered languages is emptied (e.g., to eliminate a non-empty list left over from prior iterations of steps 1812-1816 in FIG. 18). The process continues in step 1906 by selecting the first of the registered languages (e.g., languages that were registered in step 1804 of FIG. 18). The buffer is then scanned in step 1908 to determine if it contains any tagged code snippets corresponding to that language. If any such snippets are found, the corresponding language is added to the list of actually encountered languages in step 1910, and this process is repeated for the remaining registered languages via step 1912 and step 1914. Once all registered languages have been exhausted (e.g., no more registered languages available in step 1912), the process concludes at step 1916. At the end of this process 1900 (i.e., step 1916), the actual list of languages that were encountered in code snippets within the simulator netlist file (or any file it includes, which are treated in identical manner) are accounted for. Note that this list may be substantially smaller than the total available set of registered languages.

Figure 20:
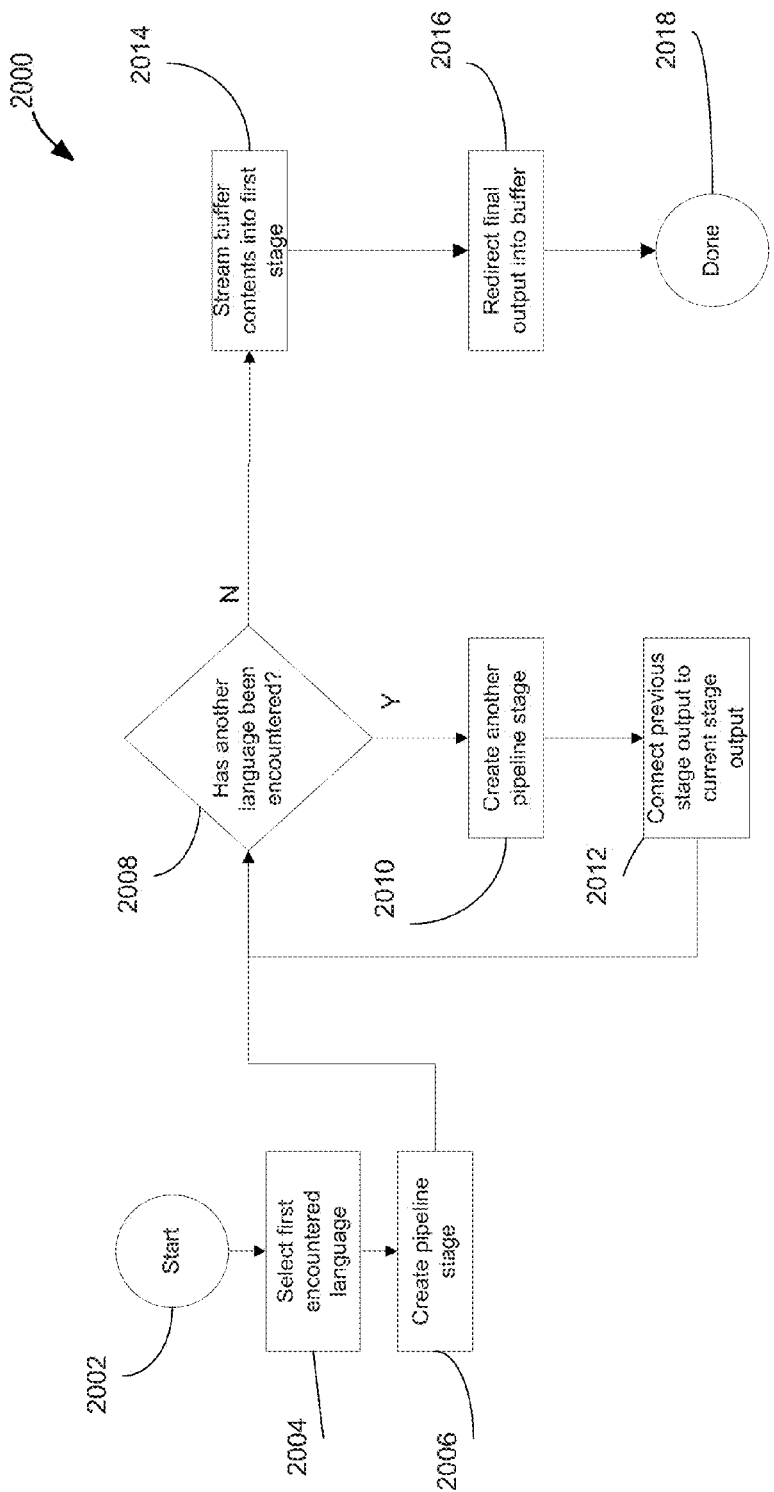
FIG. 20 is a flowchart that illustrates further detail of the embodiment of FIG. 18.

The flow chart of FIG. 20 shows further detail of step 1814 of FIG. 18. This process 2000, in which a set (e.g., pipeline) of coordinating operating system sub-processes are launched, is initialized at step 2002 by step 1814 of FIG. 18 as discussed above. In step 2004, the first actual encountered language is selected, and a pipeline stage created for that language in step 2006. This pipeline stage involves the scheduling of an operating system sub-process, which can be computationally significant, and so the reduction from the list of registered/available languages to the list of actually encountered languages (e.g., as in the process 1900 shown in FIG. 19) provides an optimization of system resources.

In step 2008 the list of encountered languages is consulted again to determine if another stage needs to be created. If so, another operating system process is scheduled in step 2010. During the scheduling operations (e.g., steps 2006, 2010), additional operating system processes are launched in which the appropriate language processor executable binary, which was mapped during the registry process of step 1804 of FIG. 18, is executed, thereby consuming a code snippet as input. In step 2012 subsequent stages are connected such that the input of a given stage is "fed by" the output of the corresponding prior stage. Each language stage replaces each of the relevant code snippets that are encountered in its input buffer with the corresponding output generated by its programming language binary, which evaluates the code snippet as input. Any other source text is passed through from input to output untouched/verbatim.

In step 2014 the Operating System (OS) process for the first stage is fed by the contents of the memory buffer. The processes are then executed by the operating system in a falling-domino-like manner, with each stage feeding the next. The final-stage output is captured at step 2016 and used to finally replace the contents of the memory buffer at step 1816 of FIG. 18. As discussed above, the final contents of the memory buffer are then fed to the parser 208 at step 1820 of FIG. 18.

Figure 21:
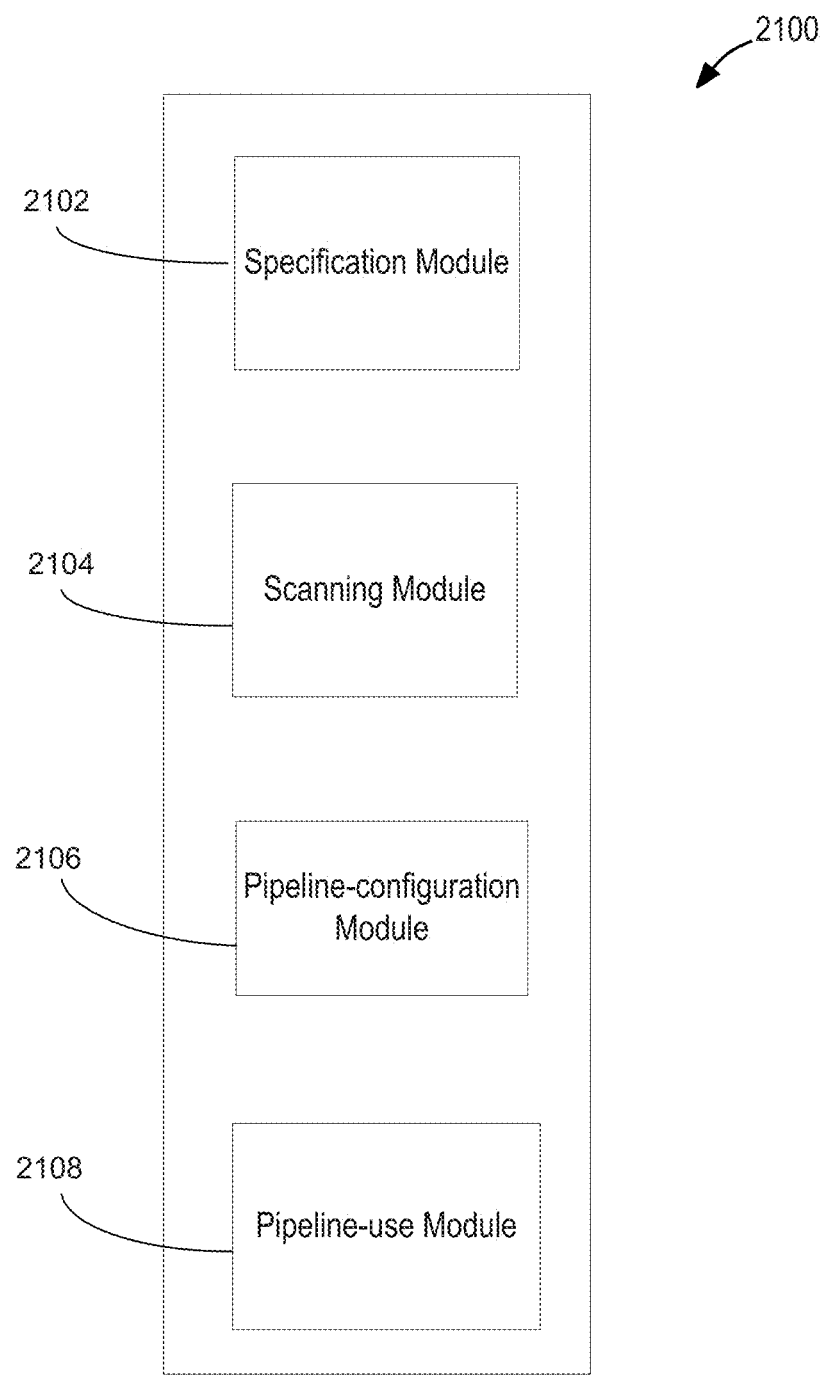
FIG. 21 is a schematic representation of an apparatus configured to preprocess a netlist description according to another example embodiment.

FIG. 21 shows a schematic representation of an apparatus 2100 (or system) configured to preprocess a netlist description that includes one or more embedded code segments for describing a circuit according to another example embodiment. The apparatus includes at least one computer to perform operations that support the modules of the apparatus. A specification module 2102 specifies one or more programming languages to generate netlist code through scripting operations of the one or more programming languages. A scanning module 2104 scans the netlist description to identify the one or more embedded code segments where an embedded code segment is written in an identified programming language from the one or more specified programming languages. The embedded code segment is used to generate a preprocessed segment that includes at least some netlist code to replace the embedded code segment in the netlist description through the scripting operations of the identified programming language.

A pipeline-configuration module 2106 configures a pipeline preprocessor to receive the netlist description and sequentially process the netlist description through one or more programming-language preprocessors that correspond to the one or more identified programming languages. Each programming-language preprocessor operates on at least one embedded code segment written in its corresponding programming language to generate at least one preprocessed segment that replaces the at least one embedded code segment in the netlist description. A pipeline-use module 2108 uses the pipeline preprocessor to generate a preprocessed netlist description, where the one or more embedded code segments have been replaced by the one or more preprocessed segments in the preprocessed netlist description.

Figure 22:
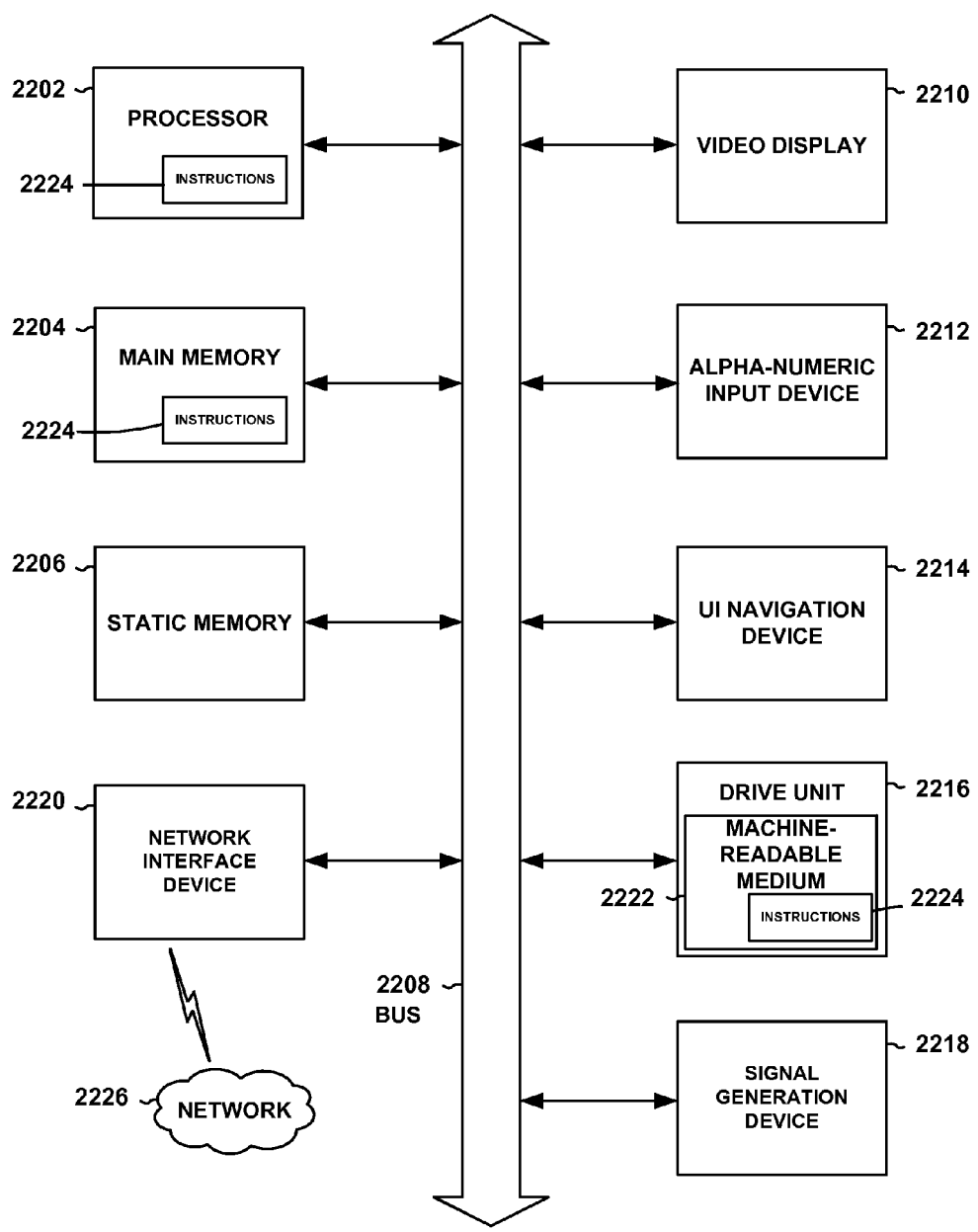
FIG. 22 is a block diagram of a computer processing system within which a set of instructions for causing the computer to perform any one of the methodologies discussed herein may be executed.

FIG. 22 is a block diagram of machine in the example form of a computer system 2200 within which instructions for causing the machine to perform any one or more of the methodologies discussed here may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 2200 includes a processor 2202 (e.g., a central processing unit (CPU), a graphics processing unit (GPU) or both), a main memory 2204 and a static memory 2206, which communicate with each other via a bus 2208. The computer system 2200 may further include a video display unit 2210 (e.g., a liquid crystal display (LCD) or a cathode ray tube (CRT)). The computer system 2200 also includes an alphanumeric input device 2212 (e.g., a keyboard), a user interface (UI) navigation device 2214 (e.g., a mouse), a disk drive unit 2216, a signal generation device 2218 (e.g., a speaker) and a network interface device 2220.

In some contexts, a computer-readable medium may be described as a machine-readable medium. The disk drive unit 2216 includes a machine-readable medium 2222 on which is stored one or more sets of data structures and instructions 2224 (e.g., software) embodying or utilizing any one or more of the methodologies or functions described herein. The instructions may also reside, completely or at least partially, within the main memory 2204 and/or within the processor 2202 during execution thereof by the computer system 2200, with the main memory 2204 and the processor 2202 also constituting machine-readable media.

While the machine-readable medium 2222 is shown in an example embodiment to be a single medium, the terms "machine-readable medium" and "computer-readable medium" may each refer to a single medium or multiple media (e.g., a centralized or distributed database, and/or associated caches and servers) that store the one or more sets of data structures and instructions 2224. These terms shall also be taken to include any tangible medium that is capable of storing, encoding or carrying instructions for execution by the machine and that cause the machine to perform any one or more of the methodologies disclosed herein, or that is capable of storing, encoding or carrying data structures utilized by or associated with such instructions. These terms shall accordingly be taken to include, but not be limited to, solid-state memories, and optical and magnetic media. Specific examples of machine-readable or computer-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; Compact Disc Read-Only Memory (CD-ROM) and Digital Versatile Disc Read-Only Memory (DVD-ROM).

The instructions 2224 may further be transmitted or received over a communications network 2226 using a transmission medium. The instructions 2224 may be transmitted using the network interface device 2220 and any one of a number of well-known transfer protocols (e.g., Hypertext Transfer Protocol (HTTP)). Examples of communication networks include a local area network (LAN), a wide area network (WAN), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Certain embodiments are described herein as including logic or a number of components, modules, or mechanisms. Modules may constitute either software modules or hardware-implemented modules. A hardware-implemented module is a tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module (e.g., a computer-implemented module) may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" (e.g., a "computer-implemented module") should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., Application Program Interfaces (APIs)).

Although only certain embodiments have been described in detail above, those skilled in the art will readily appreciate that many modifications are possible without materially departing from the novel teachings of this disclosure. For example, aspects of embodiments disclosed above can be combined in other combinations to form additional embodiments. Accordingly, all such modifications are intended to be included within the scope of this disclosure.

What is claimed is:

1. A method of preprocessing a netlist description that includes one or more embedded code segments for describing a circuit, the method comprising:
specifying one or more programming languages to generate netlist code through scripting operations of the one or more programming languages;
scanning the netlist description to identify the one or more embedded code segments and the corresponding programming language of each embedded code segment from the one or more specified programming languages, the embedded code segment generating a preprocessed segment to replace the embedded code segment in the netlist description through the scripting operations of the identified programming language, and the preprocessed segment including at least some netlist code;
configuring a pipeline preprocessor to receive the netlist description and sequentially process the netlist description through one or more programming-language preprocessors that correspond to the one or more identified programming languages, each programming-language preprocessor operating on at least one embedded code segment written in its corresponding programming language to generate at least one preprocessed segment that replaces the at least one embedded code segment in the netlist description; and
using the pipeline preprocessor to generate a preprocessed netlist description, the one or more embedded code segments being replaced by the one or more preprocessed segments in the preprocessed netlist description.

2. The method of claim 1, wherein the scripting operations of a first identified programming language include at least one control structure that generates corresponding netlist code by performing a branching operation of the first programming language.

3. The method of claim 1, wherein the scripting operations of a first identified programming language include at least one control structure that generates corresponding netlist code by evaluating a state of an internal variable to select from a plurality of options for generating the corresponding netlist code.

4. The method of claim 1, wherein the scripting operations of a first identified programming language include at least one control structure that generates corresponding netlist code by accessing the corresponding netlist code from an external site that is identified by a uniform resource identifier.

5. The method of claim 1, wherein the one or more identified programming languages include a plurality of identified programming languages and the pipeline preprocessor includes a plurality of corresponding programming-language preprocessors.

6. The method of claim 1, wherein the netlist description is a first netlist description, the preprocessed first netlist description is a second netlist description that includes one or more second embedded code segments for describing the circuit, and the method further comprises:
scanning the second netlist description to identify the one or more second embedded code segments and the corresponding second programming language of each second embedded code segment from the one or more specified programming languages, the second embedded code segment generating a second preprocessed segment to replace the second embedded code segment in the second netlist description through the scripting operations of the identified second programming language, and the second preprocessed segment including at least some netlist code;
configuring a second pipeline preprocessor to receive the second netlist description and sequentially process the second netlist description through one or more second programming-language preprocessors that correspond to the one or more identified second programming languages, each second programming-language preprocessor operating on at least one second embedded code segment written in its corresponding second programming language to generate at least one second preprocessed segment that replaces the at least one second embedded code segment in the second netlist description; and
using the second pipeline preprocessor to generate a second preprocessed netlist description, the one or more second embedded code segments being replaced by the one or more second preprocessed segments in the second preprocessed netlist description.

7. The method of claim 1, further comprising:
reading the netlist description from a file in a storage system;
parsing the preprocessed netlist description to determine the netlist elements; and processing the netlist elements in a netlist engine to simulate the circuit.

8. A non-transitory computer-readable medium that stores a computer program for preprocessing a netlist description that includes one or more embedded code segments for describing a circuit, the computer program including instructions that, when executed by a computer, cause the computer to perform operations comprising:
- specifying one or more programming languages to generate netlist code through scripting operations of the one or more programming languages;
- scanning the netlist description to identify the one or more embedded code segments and the corresponding programming language of each embedded code segment from the one or more specified programming languages, the embedded code segment generating a preprocessed segment to replace the embedded code segment in the netlist description through the scripting operations of the identified programming language, and the preprocessed segment including at least some netlist code;
- configuring a pipeline preprocessor to receive the netlist description and sequentially process the netlist description through one or more programming-language preprocessors that correspond to the one or more identified programming languages, each programming-language preprocessor operating on at least one embedded code segment written in its corresponding programming language to generate at least one preprocessed segment that replaces the at least one embedded code segment in the netlist description; and
- using the pipeline preprocessor to generate a preprocessed netlist description, the one or more embedded code segments being replaced by the one or more preprocessed segments in the preprocessed netlist description.

9. The computer-readable medium of claim 8, wherein the scripting operations of a first identified programming language include at least one control structure that generates corresponding netlist code by performing a branching operation of the first programming language.

10. The computer-readable medium of claim 8, wherein the scripting operations of a first identified programming language include at least one control structure that generates corresponding netlist code by evaluating a state of an internal variable to select from a plurality of options for generating the corresponding netlist code.

11. The computer-readable medium of claim 8, wherein the scripting operations of a first identified programming language include at least one control structure that generates corresponding netlist code by accessing the corresponding netlist code from an external site that is identified by a uniform resource identifier.

12. The computer-readable medium of claim 8, wherein the one or more identified programming languages include a plurality of identified programming languages and the pipeline preprocessor includes a plurality of corresponding programming-language preprocessors.

13. The computer-readable medium of claim 8, wherein the netlist description is a first netlist description, the preprocessed first netlist description is a second netlist description that includes one or more second embedded code segments for describing the circuit, and the computer program further includes instructions that, when executed by the computer, cause the computer to perform operations comprising:
- scanning the second netlist description to identify the one or more second embedded code segments and the corresponding second programming language of each second embedded code segment from the one or more specified programming languages, the second embedded code segment generating a second preprocessed segment to replace the second embedded code segment in the second netlist description through the scripting operations of the identified second programming language, and the second preprocessed segment including at least some netlist code;
- configuring a second pipeline preprocessor to receive the second netlist description and sequentially process the second netlist description through one or more second programming-language preprocessors that correspond to the one or more identified second programming languages, each second programming-language preprocessor operating on at least one second embedded code segment written in its corresponding second programming language to generate at least one second preprocessed segment that replaces the at least one second embedded code segment in the second netlist description; and
- using the second pipeline preprocessor to generate a second preprocessed netlist description, the one or more second embedded code segments being replaced by the one or more second preprocessed segments in the second preprocessed netlist description.

14. The computer-readable medium of claim 8, wherein the computer program further includes instructions that, when executed by the computer, cause the computer to perform operations comprising:
- reading the netlist description from a file in a storage system;
- parsing the preprocessed netlist description to determine the netlist elements; and
- processing the netlist elements in a netlist engine to simulate the circuit.

15. An apparatus configured to preprocess a netlist description that includes one or more embedded code segments for describing a circuit, the apparatus comprising at least one computer to perform operations that provide:
- a specification module to specify one or more programming languages to generate netlist code through scripting operations of the one or more programming languages;
- a scanning module to scan the netlist description to identify the one or more embedded code segments and the corresponding programming language of each embedded code segment from the one or more specified programming languages, the embedded code segment generating a preprocessed segment to replace the embedded code segment in the netlist description through the scripting operations of the identified programming language, and the preprocessed segment including at least some netlist code;
- a pipeline-configuration module to configure a pipeline preprocessor to receive the netlist description and sequentially process the netlist description through one or more programming-language preprocessors that correspond to the one or more identified programming languages, each programming-language preprocessor operating on at least one embedded code segment written in its corresponding programming language to generate at least one preprocessed segment that replaces the at least one embedded code segment in the netlist description; and
- a pipeline-use module to use the pipeline preprocessor to generate a preprocessed netlist description, the one or more embedded code segments being replaced by the one or more preprocessed segments in the preprocessed netlist description.

16. The apparatus of claim 15, wherein the scripting operations of a first identified programming language include at least one control structure that generates corresponding netlist code by performing a branching operation of the first programming language.

17. The apparatus of claim 15, wherein the scripting operations of a first identified programming language include at least one control structure that generates corresponding netlist code by evaluating a state of an internal variable to select from a plurality of options for generating the corresponding netlist code.

18. The apparatus of claim 15, wherein the scripting operations of a first identified programming language include at least one control structure that generates corresponding netlist code by accessing the corresponding netlist code from an external site that is identified by a uniform resource identifier.

19. The apparatus of claim 15, wherein the one or more identified programming languages include a plurality of identified programming languages and the pipeline preprocessor includes a plurality of corresponding programming-language preprocessors.

20. The apparatus of claim 15, wherein the netlist description is a first netlist description, the preprocessed first netlist description is a second netlist description that includes one or more second embedded code segments for describing the circuit, and the at least one computer further performs operations, wherein the scanning module scans the second netlist description to identify the one or more second embedded code segments and the corresponding second programming language of each second embedded code segment from the one or more specified programming languages, the second embedded code segment generating a second preprocessed segment to replace the second embedded code segment in the second netlist description through the scripting operations of the identified second programming language, and the second preprocessed segment including at least some netlist code;

the pipeline-configuration module configures a second pipeline preprocessor to receive the second netlist description and sequentially process the second netlist description through one or more second programming-language preprocessors that correspond to the one or more identified second programming languages, each second programming-language preprocessor operating on at least one second embedded code segment written in its corresponding second programming language to generate at least one second preprocessed segment that replaces the at least one second embedded code segment in the second netlist description; and the pipeline-use module uses the second pipeline preprocessor to generate a second preprocessed netlist description, the one or more second embedded code segments being replaced by the one or more second preprocessed segments in the second preprocessed netlist description.

21. The apparatus of claim 15, further comprising:
a reader to read the netlist description from a file in a storage system;
a parser to parse the preprocessed netlist description to determine the netlist elements; and
an engine to process the netlist elements to simulate the circuit.

* * * * *